United States Patent [19]

Kuroda

[11] Patent Number: 4,939,751
[45] Date of Patent: Jul. 3, 1990

[54] PHASE SIGNAL FILTERING APPARATUS UTILIZING ESTIMATED PHASE SIGNAL

[75] Inventor: Masahiro Kuroda, Atsugi, Japan

[73] Assignee: Anritsu Corporation, Tokyo, Japan

[21] Appl. No.: 257,326

[22] Filed: Oct. 13, 1988

[30] Foreign Application Priority Data

Oct. 23, 1987 [JP] Japan ................... 62-267416
Jul. 1, 1988 [JP] Japan ................... 63-165286

[51] Int. Cl.$^5$ ............................................ H04L 27/16
[52] U.S. Cl. ................................. 375/80; 375/82; 375/120; 331/11
[58] Field of Search ............... 375/80, 82, 87, 95, 375/110, 119, 120; 331/10–14, 17, 25; 455/260; 343/352, 357, 396; 364/446, 458; 370/104

[56] References Cited

U.S. PATENT DOCUMENTS

| | | | |
|---|---|---|---|
| 4,365,211 | 12/1982 | Lee ........................... | 375/120 |
| 4,445,184 | 4/1984 | Taylor et al. .............. | 343/357 |
| 4,453,165 | 6/1984 | Maine ........................ | 34/418 |
| 4,457,006 | 6/1984 | Maine ........................ | 375/97 |
| 4,468,793 | 8/1984 | Johnson et al. ............ | 375/97 |
| 4,495,473 | 1/1985 | Treise ........................ | 331/25 |
| 4,574,243 | 3/1986 | Levine ....................... | 375/120 |
| 4,591,730 | 5/1986 | Pennoni ..................... | 370/104 |
| 4,613,977 | 9/1986 | Wong et al. ................ | 375/97 |
| 4,661,965 | 4/1987 | Maru ......................... | 375/82 |
| 4,667,203 | 5/1987 | Counselmann ............. | 342/357 |
| 4,807,256 | 2/1989 | Holmes et al. ............. | 375/97 |

OTHER PUBLICATIONS

System Specification for the Navstar Global Positioning System, SS-GPS-300B, Mar. 3, 1980.
Guide to GPS Positioning—prepared under the leadership of David Wells, Canadian GPS Associates 1986.

Primary Examiner—Benedict V. Safourek
Assistant Examiner—Stephen Chin
Attorney, Agent, or Firm—Frishauf, Holtz, Goodman & Woodward

[57] ABSTRACT

A phase signal estimator receives a first phase signal having a first frequency and generates a first filtered signal phase-locked with the first phase signal as an estimated phase signal. A phase locked loop section receives a second phase signal having a second frequency which corresponds to a predetermined multiple of the first frequency of the first phase signal, and outputs a second filtered signal phase-locked with the second phase signal as a desired phase signal. In the phase locked loop section, a phase comparator receives the second phase signal and the desired phase signal and generates a phase difference signal. A filter low-pass filters the phase difference signal from the phase comparator. A signal generator generates a signal having a predetermined frequency in accordance with the output from the filter. A phase adder adds the signal having the predetermined frequency from the signal generator and the estimated phase signal from the phase signal estimator and outputs the desired phase signal. A frequency compensator is selectively connected to the estimated phase signal, the second phase signal, and the desired phase signal so that the phase locked loop section has sustantially the same low-pass filtering response characteristic as the first frequency of the first phase signal.

12 Claims, 3 Drawing Sheets

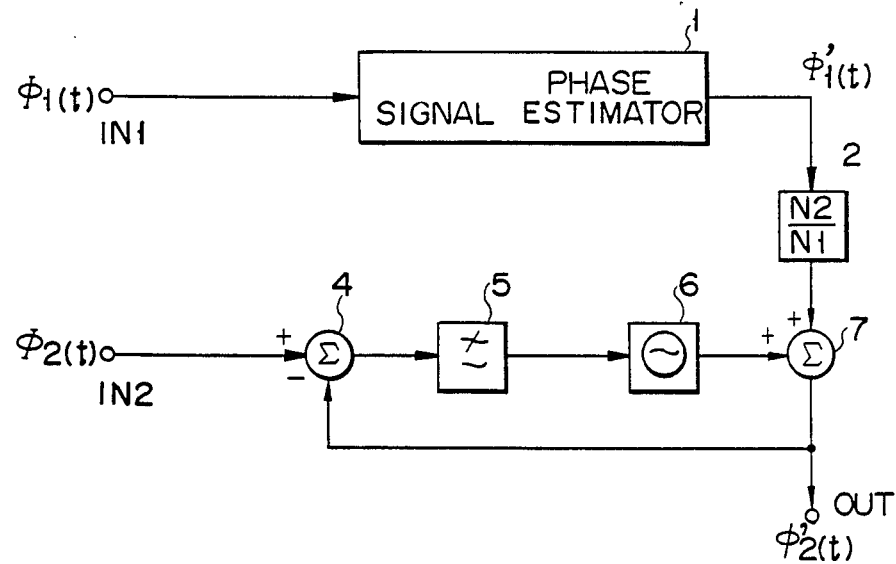
F I G. 1
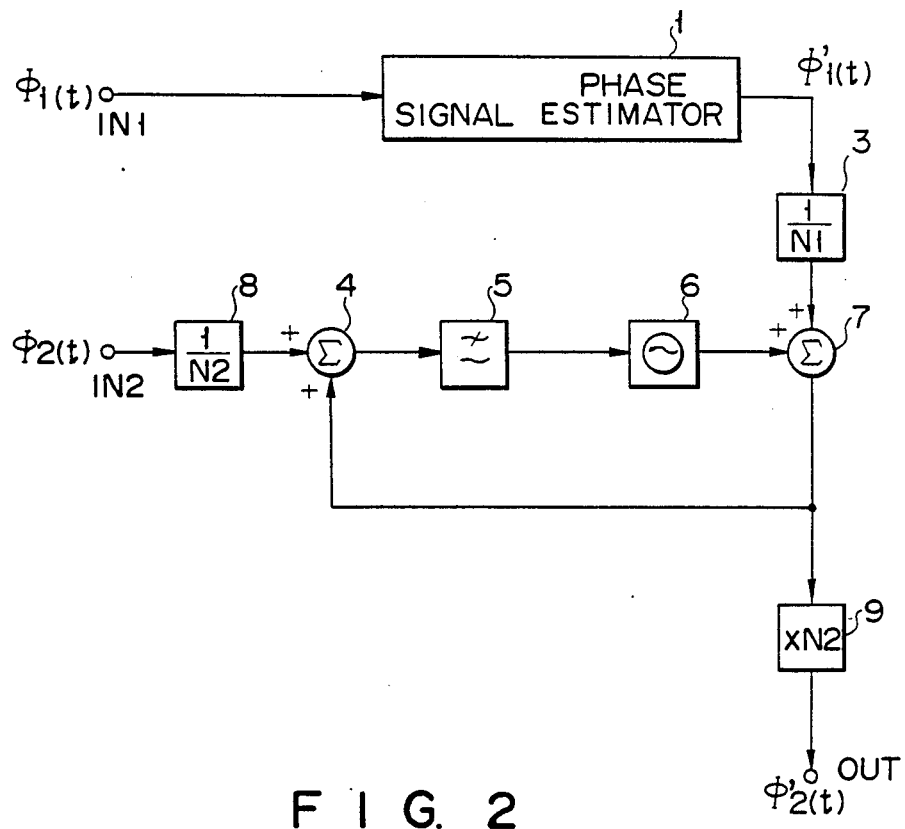
F I G. 2

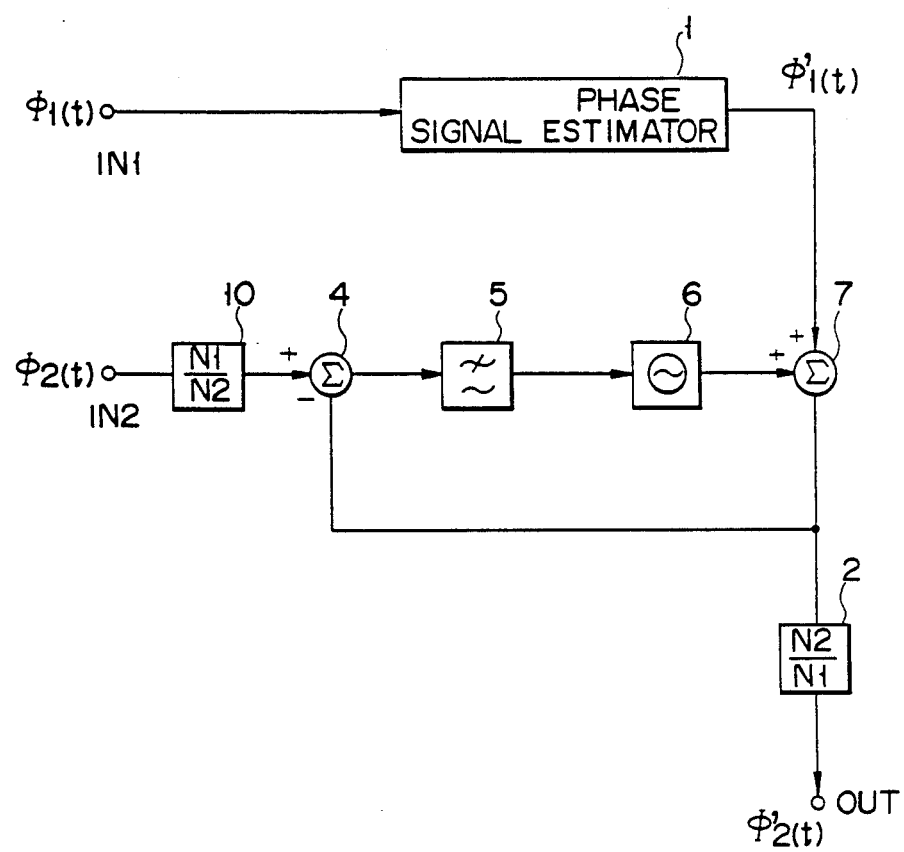
F I G. 3

PHASE SIGNAL FILTERING APPARATUS UTILIZING ESTIMATED PHASE SIGNAL

BACKGROUND OF THE INVENTION

1. Field of the Invention

The present invention generally relates to a technique for filtering signals, and more particularly to a technique for extracting a desired component from signals transmitted by an artifical satellite and smeared by noise.

Furthermore, the present invention relates to a signal parameter estimation, and more particularly to a technique for estimating signal parameters by processing the signal composed of two or more signals which are mutually coherent and the frequencies of which are rational to each other, and that rapidly change its parameters such as accelerated Doppler frequency.

The present invention relates to a technique for determining the receiver position or for estimating orbital parameters of an artifical heavenly body by recovering phase signal from a received signal and analysing them, and more particularly to a technique for determining the position on or near by the surface of the Earth by receiving signals transmitted from the NAVSTAR/- Global Positioning System (GPS)(which is) described in detail in a publication "SYSTEM SPECIFICATION FOR THE NAVSTAR GLOBAL POSITIONING SYSTEM, SS-GPS-300B, Mar. 3, 1980".

Furthermore, the present invention relates to a technique for determining the baseline sector between a pair of receiver points or the baseline network consist of several receiver points on or near by the surface of the Earth by analysing the signals received by the receivers respectively.

The present invention relates to an apparatus for performing the absolute positioning or the relative positioning by receiving and analysing the signals transmitted from the GPS satellite and more particularly PLL (Phase Locked Loop) an apparatus for reproducing the original signal as faithful as possible.

2. Description of the Related Art

The theoretical background of this patent will be described herein with reference to a geodetic positioning system utilizing a GPS. The fact described below is universal and can be easily applied to similar geodetic positioning systems, as a matter of course. Time series signal s(t) is generally given by:

$$s(t) = A(t)\exp\{j\Phi(t)\} \quad (1)$$

where $A(t)$ is the amplitude of the signal, $j$ is $\sqrt{-1}$ and $\Phi(t)$ is the phase of the signal.

If two signals $s_1(t)$ and $s_2(t)$ are given by the following equations:

$$s_1(t) = A_1(t)\exp\{j\Phi_1(t)\} \quad (2\text{-}1)$$

$$s_2(t) = A_2(t)\exp\{j\Phi_2(t)\} \quad (2\text{-}2)$$

when these signals are coherent to each other, the two phase components $\Phi_1(t)$ and $\Phi_2(t)$ have a relation:

$$\Phi_2(t) = k\Phi_1(t) + n(t) + \Phi_0 \quad (3)$$

Where k is a constant, $\Phi_0$ is the constant phase shift, and $n(t)$ is a mean value of which represents the Erogodic random (noise) with zero mean value. In other words, when the two signals are coherent to each other, a phase ratio of the two signals must be fixed, and a phase difference between the two signals must be resented by the Ergodic stochastic process. A signal generated from a space vehicle is often a composite signal of some signals having a coherent phase relationship. In particular, this fact is conspicuous for a signal generated from a GPS satellite.

The signal format of a GPS satellite can be given by the following equation, as described in Sections 6 and 7 of the article entitled "Guide to GPS positioning, Prepared under the Leadership of David Wells, Canadian GPS Associates, 1986":

$$s(t) = Ac \cdot C(t)D(t)\cos(2\pi f_1 t + \Phi c) + \quad (4)$$
$$A \cdot P(t)D(t)\sin(2\pi f_1 t + \Phi p) + Ap \cdot P(t)D(t)\sin(2\pi f_2 t + \Phi p)$$

where Ac is the modulation level of a C/A (Coarse/Acquisition) code, Ap is the modulation level of a P (Precision) code, C(t) is the binary C/A-code modulation signal having a chip rate of 1.023 Mbps, P(t) is the binary P-code modulation signal having a chip rate of 10.23 Mbps, D(t) is the binary data modulation signal having a baud rate of 50 bps, $f_1$ is the carrier frequency of $L_1$, $f_2$ is the carrier frequency of $L_2$, $\Phi c$ is the initial phase of the C/A-code modulation signal, and $\Phi_p$ is the initial phase of the P-code modulation signal.

The characteristic feature of a signal from a GPS satellite is remarkably different from that of a conventional digital communication system in that the frequencies of all the modulation signal clocks and all the carriers are coherent to each other, and have integral ratio (rational) relationships. More specifically, if a fundamental frequency=$f_0$, the relationships among the frequencies are given by:

$$f_{C/A} = f_0/10 \quad (5\text{-}1)$$

$$f_p = f_0 \quad (5\text{-}2)$$

$$f_{L1} = 154 f_0 \quad (5\text{-}3)$$

$$f_{L2} = 120 f_0 \quad (5\text{-}4)$$

where $f_0$ is the fundamental frequency=10.23 MHz, $f_{C/A}$ is the chip rate of the C/A code, $f_p$ is the chip rate of the P code, $f_{L1}$ is the $L_1$ carrier frequency, and $f_{L2}$ is the $L_2$ carrier frequency.

The relationships among the phase signals obtained by reproducing the clocks of the C/A and P codes and the phase signals of the two carriers are thus derived as follows:

$$\Phi_p(t) = 10\Phi_{C/A}(t) \quad (6\text{-}1)$$

$$\Phi_{L1}(t) = 154\Phi_p(t) \quad (6\text{-}2)$$

$$\Phi_{L2}(t) = 120\Phi_p(t) \quad (6\text{-}3)$$

where $\Phi_{C/A}(t)$ is the clock phase signal of the C/A code, $\Phi_p(t)$ is the clock phase signal of the P code, $\Phi_{L1}(t)$ is the phase signal of the $L_1$ carrier, and $\Phi_{L2}(t)$ is the phase signal of the $L_2$ carrier.

Time function r(t) of a range between an artificial celestial body and a receiver station can be given by the following equation using phase signal $\Phi r(t)$ obtained by reproducing the signal generated from the artificial celestial body:

$$r(t) = -\lambda \cdot \Phi r(t)/(2\pi) + B \cdot c \quad (7)$$

where $\lambda$ is the wavelength of the phase signal, B is the time bias between the time system of the space vehicle and the time system of the receiver station, and c is the velocity of light.

Time function $\rho(t)$ obtained by omitting the second term of the right-hand side of the equation ($\eta$) is called a pseudo range since it is biassing as B.C. as against to the true range $\gamma(t)$. The pseudo range function $\rho(t)$ is presented by the flowing equation.

$$\rho(t) = -\lambda \cdot \Phi r(t)/(2\pi) \quad (8)$$

(Therefore) The positioning or ranging system utilizing GPS signals is required to recover (restore) the phase signal $\Phi \gamma(t)$ as faithful as possible.

$$\rho(t) = -\lambda \cdot \Phi r(t)/(2\pi) \quad (8)$$

In this manner, one of positioning techniques in a GPS positioning system is a technique of performing positioning by reproducing the above-mentioned phase signals as faithful as possible and obtaining a pseudo range based on the reproduced signal. However, in the conventional technique, the phase signals are independently reproduced without utilizing frequency relationships given by equations (5-1) to (5-4) and phase relationships given by equations (6-1) to (6-3).

In the conventional technique, however, the frequency relationships given by equations (5-1) to (5-4) and the phase relationships given by equations (6-1) to (6-3) are not utilized, and the PLL performance cannot be fully exhibited. Since a GPS satellite is a revolving satellite which goes around the earth once in about 12 hours, the receiving signal suffers from the Doppler effect due to the relative movement between the rotation of the earth and the movement of the satellite. The frequency shift and accelerated frequency shift of the receiving signal as a result of the Doppler effect are a maximum of about $3 \times 10^{-6}$ Hz/Hz and about $6.5 \times 10^{-10}$ Hz/Hz/sec, respectively. Thus, it is not easy to design a PLL which can be locked with such signals and can stably operate. In the PLL according to the conventional technique, the following problems are posed:

(1) Natural angular frequency $\omega_n$ of the PLL cannot be decreased much; and (2) The sampling frequency of the signal must be selected to be twice or more the maximum Doppler frequency shift to prevent an aliasing distortion problem.

Natural angular frequency $\omega_n$ of the PLL must be as low as possible in order to enhance the noise reduction effect of the PLL. Therefore, in the conventional technique, the noise reduction effect of the PLL is limited by the problem (1). Since the problem (2) undesirably determines the lower limit of the sampling frequency, a data volume required for signal processing is increased, and then much time is required for processing. In the PLL according to the conventional technique, due to the presence of the acceleration Doppler frequency shift, the following problem is also posed:

(1) A doubly integrated 3rd order or more higher order PLL must be selected as the PLL.

The problem (1) is posed because a PLL of the 3rd order must be employed so as to be phase-locked with a signal including the acceleration Doppler frequency shift (also called a frequency ramp) and not to cause a phase shift error in a steady state. However, a PLL of the 3rd order or higher is difficult to design. If possible, such a PLL generally cannot be stably operated.

More specifically, in the conventional technique, in order to reproduce a signal from an artificial celestial body, the receiving signal is often directly filtered and reproduced by a PLL.

Since receiving signal $\Phi r(t)$ is influenced by the relative movement between the artificial celestial body and the receiver station, it becomes a signal which changes rapidly. For example, in the case of the signal from a GPS satellite which goes around the earth once in about 12 hours, as described above, the frequency shift and acceleration frequency shift of the receiving signal caused by the Doppler effect are respectively a maximum of about $3 \times 10^{-6}$ Hz/Hz and about $6.5 \times 10^{-10}$ Hz/Hz/sec.

In general, a signal from a space vehicle is often a signal of very low $C/N_0$ ratio (a ratio of signal power to a power density of noise). The technique using a PLL as described above as a method of reproducing such a signal poses some problems.

One of the problems is "lock-in" problem. The lock-in characteristic of a PLL is mainly determined by the $C/N_0$ ratio of an input signal and the natural angular frequency of the PLL. If the input signal is a signal free from a change in frequency, i.e., the signal is a composite signal of a line spectrum signal and noise, then it always possible to design a PLL that can be locked to the line spectrum signal even if the $C/N_0$ ratio of the composite signal is very low by reducing the natural angular frequency of the PLL as needed (required). However, if the input signals is a composite signal of a signal having a large change in frequency and noise, the natural angular frequency of the PLL must be large enough in accordance with the magnitude of the change in frequency of the signal. In this case, the PLL cannot always be locked in depending on the $C/N_0$ ratio of the input signal. When the PLL is designed to have a high natural angular frequency, the S/N ratio of the processed signal of the PLL is degraded, and under some conditions, locking cannot be kept. If a point of compromise against these conflicting requirements cannot be found out, under some conditions of the input signal, a PLL which is locked in that signal cannot be designed. Meanwhile, if the high natural angular frequency of a PLL is set, the noise reduction effect is reduced. Thus, even if a PLL which can be locked in the above-mentioned signal can be designed, it is not preferable in view of the noise reduction effect of the PLL.

The second problem is associated with the order of a PLL (the highest order of the PLL response function represented by the Laplace transform). When a popular 2rd-order type is used as the order of the PLL, the response of the PLL has a phase error according to the magnitude of a change in frequency of the input signal, as is theoretically known. For this reason, when a signal which changes largely is required to be reproduced with high accuracy, a PLL of the 3rd order or higher must be employed.

However, a PLL of the 3rd order is difficult to design. If possible, a PLL of this type generally cannot be stably operated.

As a solution to the above-mentioned problems, a residual signal processing technique described below is known.

The residual signal processing is a technique for processing a residual between the input signal and a predicted value of the input signal instead of directly processing the input signal. Thus, the input signal to a PLL can be converted to a signal approximated to a DC one, which has a small change in frequency. Thus, the above-mentioned problems can be largely eliminated.

However, in this technique, the predicted value of the input signal must be calculated along with time. In general, a predicted value of an input signal must be calculated based on an estimated orbital parameters of a space vehicle and estimated position data of a receiver station. Therefore, the following problems are posed:

(1) The presumed orbital parameters of the artificial celestial body and the presumed position of the receiver station must be acquired in advance.

(2) A relatively complicated calculation must be made, and real-time processing and hardware are difficult to realize.

In recent years, a signal processing system is constituted by a discrete system. In this case, a signal must be sampled and quantized to perform digital processing. In this description, since signal quantization can be assumed to be achieved with infinite precision, there is no technical problem.

A signal must be sampled at a sampling frequency twice or more an effective band width of a signal according to the sampling theorem. For example, when an $L_1$ carrier signal is processed by a discrete system, since the maximum Doppler frequency of the $L_1$ carrier signal becomes about ±4.5 kHz, sampling must be made using a sampling frequency of 9 kHz or higher. It is theoretically redundant to process the signal at a sampling frequency given (determined) by the sampling theory, if the power spectrum of the signal is concentrated around the principal component of the signal by prefiltering. However, in this case, the sampling frequency cannot be easily decreased, i.e., undersampling processing cannot be easily employed because of the problem of aliasing distortion.

SUMMARY OF THE INVENTION

It is, therefore, an object of the present invention to provide a new and improved phase signal filtering apparatus in which two PLL circuits having remarkably different operation frequencies (10 times or more) are combined to constitute a filter, and which is particularly effective for reducing noise of a digital signal such as a signal from a GPS satellite.

When signal processing is performed by residual signal processing, an aliasing distortion caused by undersampling similarly occurs in both an input signal and a predicted signal. Therefore, the present inventors paid attention to the fact that if the band width of the residual signal is smaller than the sampling frequency, the problem of the aliasing distortion can be perfectly overcome, and invented a technique for reducing a calculation volume by undersampling during sampling without causing the aliasing distortion. That is, according to the present invention when a signal whose band width is limited by a pre-filter is subjected to residual signal processing, the sampling frequency of the signal can be lower than that determined according to the sampling theorem, and hence, an arithmetic operation volume to be processed within a unit time can be reduced. This improvement can moderate a requirement for an arithmetic operation speed of digital signal processing, and an inexpensive, compact signal processing apparatus can be realized. Paying attention to the fact that most signals generated from a space vehicle are composite signals of coherent signals, the present invention solves the above-mentioned problems by using some of signals as predicted signals of other input signals when the above-mentioned residual signal processing is performed. A case will be described hereinafter wherein the present invention is applied to signal reproduction of a signal from a GPS satellite. As has been described above, a frequency ratio of C/A code to P code of the signal from the GPS satellite is 1:10, a frequency ratio of P code to $L_1$ carrier is 1:154, and a frequency ratio of P code to $L_2$ carrier is 1:120.

A signal 10 times the reproduced phase signal of the C/A code can be used as a prediction signal of the P code. Similarly, signals 154 and 120 times the reproduced phase signal of the P code can be respectively used as prediction signals of the $L_1$ and $L_2$ carriers. Furthermore, a signal 120/154 times the $L_1$ carrier can be used as a prediction signal of the $L_2$ carrier. Since the chip rate of the C/A code of the signal from a GPS satellite is 1.023 MHz, the acceleration Doppler frequency measured when this signal received by an earth station is about 0.7 mHz. The acceleration Doppler frequency can be sufficiently processed without employing the above-mentioned residual signal processing for the C/A code. Therefore, a normal PLL, i.e., a PLL of the 2nd order can be employed in signal reproduction of the C/A code.

From another point of view, according to the present invention, even if the input phase signal suffers from a Doppler frequency shift and an acceleration Doppler frequency shift of higher order, if they can be estimated with sufficient accuracy, a signal corresponding to a phase difference between the input phase signal and an estimated phase signal, i.e., a phase difference signal becomes a signal from which the Doppler frequency and the accelerated Doppler frequency shift of higher order are greatly reduced. The present inventors have paid attention on this point. In a conventional PLL filtering apparatus, the input phase signal is directly PLL-filtered, while in this invention, a phase difference signal between the input phase signal and the estimated phase signal is PLL-filtered, thus solving the above problem. In this case, an estimated phase signal for the input phase signal must be estimated with high accuracy. In order to achieve this, the following techniques may be employed:

(1) Estimation is made by a calculation based on an orbital parameters of a satellite and an approximate position of a receiver station.

(2) In the GPS signal format, since all the modulation signals and all the carriers are coherent to each other and have integral frequency ratio (rational) relationships, the input phase signal is estimated by utilizing these relationships. However, in the technique (1), the orbit parameter of the satellite must be acquired in advance, and a relatively complicated calculation must be performed. Thus, it is difficult to realize an estimated algorithm by hardware. In the technique (2), no orbit parameter of the satellite is required, and the coherency of the input signals and integral frequency ratio (rational) relationships are maintained. Therefore, sequential estimation can be performed as well as simultaneous estimation, and the prediction algorithm can easily be realized by hardware. In this invention, the input phase signal is estimated by the technique (2). In order to calculate a predicted value of a P-code phase signal, a PLL-filtered C/A code phase signal is used, and in order to calculate a predicted value of a carrier phase signal, the PLL-filtered P-code phase signal is used. Since the Doppler frequency shift and the accelerated Doppler frequency shift of the input signals are proportional to the frequency of the input signal, the Doppler frequency and the accelerated Doppler frequency of a C/A-code input signal are respectively as low as about 3 Hz and 0.7 mHz, and the influence of the Doppler effect can be ignored. Therefore, the technique (2) is not required to PLL-filter the C/A-code phase signal, and the input signal is directly PLL-filtered like in the conventional technique.

According to one aspect of the present invention, there is provided a phase signal filtering apparatus comprising:

phase signal estimation means for receiving a first phase signal having a first frequency and generating a first filtered signal phase-locked with the first phase signal as an estimated phase signal;

phase locked loop means for receiving a second phase signal having a second frequency which corresponds to a predetermined multiple of the first frequency of the first phase signal, and outputting a second filtered signal phase-locked with the second phase signal as a desired phase signal, the phase locked loop means comprising:

phase comparator means for receiving the second phase signal and the desired phase signal and generating a phase difference signal;

filtering means for low-pass filtering the phase difference signal from the phase comparator means;

signal generating means for generating a signal having a predetermined frequency in accordance with the output from the filtering means; and phase adder means for adding the signal having the predetermined frequency from the signal generating means and the estimated phase signal from the phase signal estimation means and outputting the desired phase signal; and frequency compensation means selectively connected to the estimated phase signal, the second phase signal, and the desired phase signal so that the phase locked loop means has substantially the same low-pass filtering response characteristic as the first frequency of the first phase signal.

BRIEF DESCRIPTION OF THE DRAWINGS

These and other objects and features of the present invention can be understood through the following embodiments by reference to the accompanying drawings, in which:

FIG. 1 is a block diagram showing a first embodiment of a phase signal filtering apparatus according to the present invention;

FIG. 2 is a block diagram showing a second embodiment of a phase signal filtering apparatus according to the present invention;

FIG. 3 is a block diagram showing a third embodiment of a phase signal filtering apparatus according to the present invention.

DETAILED DESCRIPTION OF THE PREFERRED EMBODIMENTS

Figure 4:
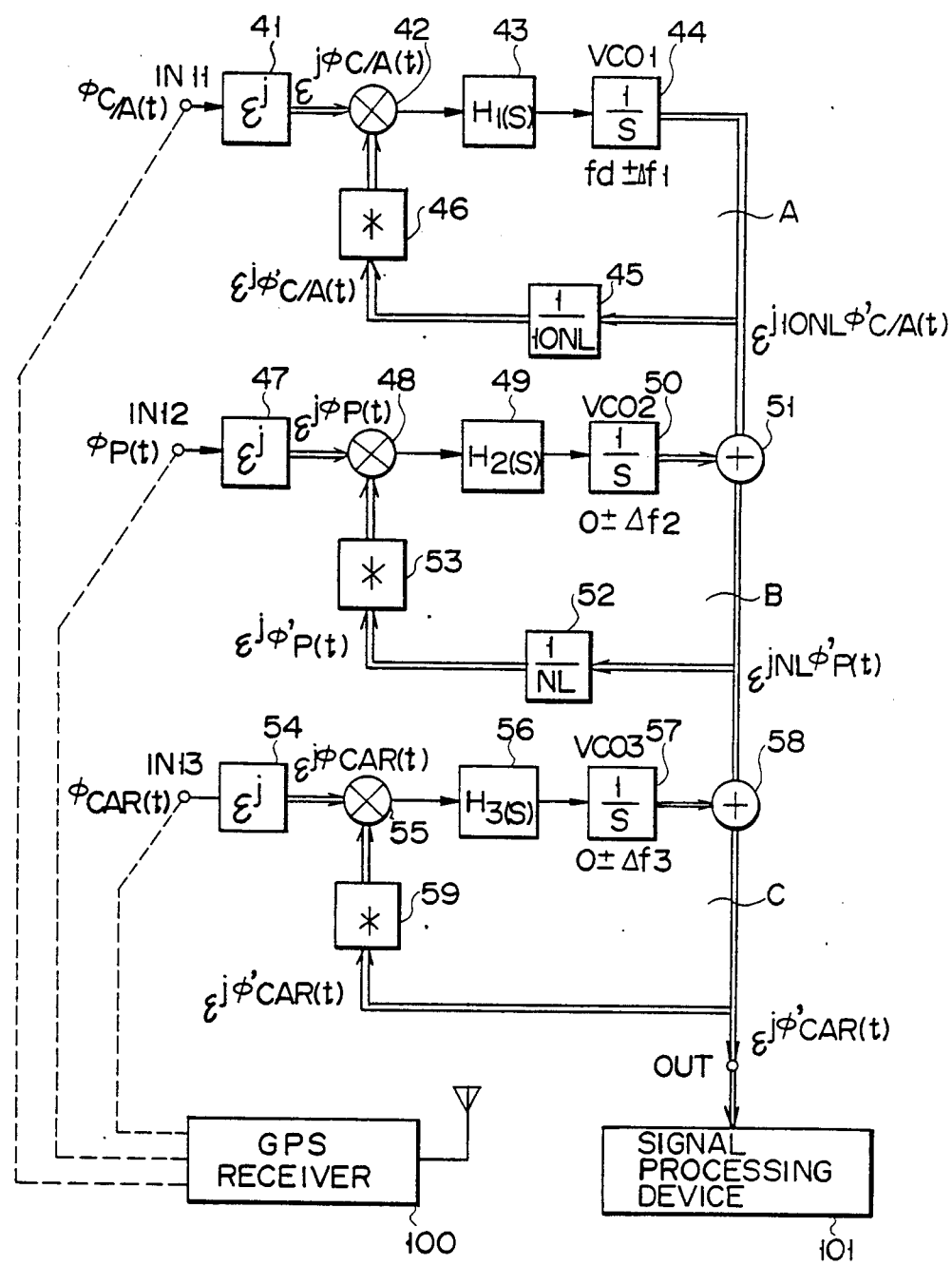
FIG. 4 is a block diagram showing a fourth embodiment wherein the present invention is applied to a GPS signal filtering apparatus.

FIG. 1 shows a first embodiment of the present invention. In this embodiment, first signal $\Phi_1(t)$ and second signal $\Phi_2(t)$ are received as input signals at input terminals $IN_1$ and $IN_2$, and estimated phase signal $\Phi_{2'}(t)$ of second signal $\Phi_2(t)$ is output from output terminal OUT. First and second signals $\Phi_1(t)$ and $\Phi_2(t)$ are related by the following equation:

$$\Phi_1(t)/N_1 = \Phi_2(t)/N_2 \qquad (9)$$

This equation is modified as:

$$\Phi_2(t) = \Phi_1(t) \cdot N_2/N_1 \qquad (10)$$

As can be understood from equation (10), if $\Phi_1(t) < \Phi_2(t)$, generality is not lost.

Assume that the frequency of $\Phi_1(t)$ is sufficiently low, hence, an acceleration component of a Doppler frequency caused by the relative movement between an artificial satellite and a receiver station is low, and this signal can be easily reproduced (filtered) by estimated signal generator 1 using a PLL filtering apparatus of a typical single-stage arrangement.

First signal $\Phi_1(t)$ received at input terminal $IN_1$ is supplied to phase signal estimator 1, is filtered, and output as assumed phase signal $\Phi_{1'}(t)$. Estimated phase signal $\Phi_{1'}(t)$ is converted to a signal from which noise is reduced upon operation such as averaging by phase signal estimator 1, and is used as a prediction signal for second signal $\Phi_2(t)$. The estimated phase signal is called a "prediction signal" since a smooth signal obtained by reducing noise can be estimated to be a true phase signal in consideration of movement of an artificial celestial body like in, e.g., a GPS signal filtering apparatus.

The characteristic feature of the present invention is to utilize this estimated phase signal.

Estimated phase signal $\Phi_{1'}(t)$ output from phase signal estimator is multiplied with $N_2/N_1$ by first frequency divider/multiplier 2. First signal $\Phi_2(t)$ is applied to the "+" input of phase comparator 4. The output from phase comparator 4 is applied to low-pass filter 5, and is then applied to voltage controlled oscillator (VCO) 6. As a result, VCO 6 outputs a signal having a frequency corresponding to the output from filter 5. This signal is applied to the "+" input of phase adder 7, and is added to the output from first frequency divider/multiplier 2. Thus, desired filtered output signal $\Phi_{2'}(t)$ appears at output terminal OUT. Output signal $\Phi_{2'}(t)$ is also applied to the "−" input of phase comparator 4, and phase-compared with second signal $\Phi_2(t)$.

As can be seen from the arrangement shown in FIG. 1, a PLL circuit which outputs second signal $\Phi_2(t)$ as substantially equivalent output signal $\Phi_{2'}(t)$ is constituted by phase comparator 4, low-pass filter 5, VCO 6, and phase adder 7. In this case, since a circuit portion between low-pass filter 5 and VCO 6 has a low-pass response characteristic, noise can be suppressed. In addition, as the characteristic feature of this circuit arrangement, since phase adder 7 is included and the estimated phase signal is utilized, a Doppler shift effect of a signal from a satellite like in the GPS signal filtering apparatus can be suppressed by the noise reduction process, i.e., the output stage of phase comparator 4. Since the estimated phase signal is reproduced from first signal $\Phi_1(t)$, a large-scale apparatus such as a Doppler shift signal generator need not be used.

Even if first and second signals $\Phi_1(t)$ and $\Phi_2(t)$ are either analog or sampled digital signals, the arrangement of FIG. 1 is basically left unchanged. When first and second signals $\Phi_1(t)$ and $\Phi_2(t)$ are digital signals, even if the sampling frequency is decreased to achieve a so-called undersampling state, no problem is posed as long as first and second signals $\Phi_1(t)$ and $\Phi_2(t)$ are subjected to predetermined band-width limitation.

FIG. 2 shows a second embodiment of the present invention. In this embodiment, first and second signals $\Phi_1(t)$ and $\Phi_2(t)$ are received as input signals at input terminals IN$_1$ and IN$_2$ and estimated phase signal $\Phi_{2'}(t)$ of second signal $\Phi_2(t)$ is output from output terminal OUT like in the first embodiment. However, in this embodiment, equation (9) is used to perform phase comparison unlike in the first embodiment. Therefore, the same reference numerals in FIG. 2 denote the same parts as in FIG. 1, and a detailed description thereof will be omitted.

First signal $\Phi_1(t)$ is applied to phase signal estimator 1 and is filtered. Thereafter, the filtered signal is frequency divided by N$_1$ by first frequency divider 3, and is input to one input of phase adder 7. Second signal $\Phi_2(t)$ is frequency divided by N$_2$ by second frequency divider 8 to be converted to a $\Phi_2(t)$/N$_2$ signal, and the signal is applied to the "+" input of phase comparator 4.

The output from phase comparator 4 is applied to low-pass filter 5, and is then applied to VCO 6. As a result, a signal having a frequency corresponding to the output from filter 5 is generated from VCO 6. This signal is applied to one input of phase adder 7 and is added to the output from first frequency divider 3. Thus, adder 7 outputs $\Phi_{2'}(t)$/N$_2$.

Output signal $\Phi_{2'}(t)$/N$_2$ is also applied to one input of phase comparator 4, and is phase-compared with output signal $\Phi_{2'}(t)$/N$_1$.

Output signal $\Phi_2(t)$/N$_2$ from phase adder 7 is multiplied with N$_2$ by multiplier 9. As a result, desired filtered output signal $\Phi_{2'}(t)$ appears at output terminal OUT.

FIG. 3 shows a third embodiment of the present invention. In this embodiment, first and second signals $\Phi_1(t)$ and $\Phi_2(t)$ are received as input signals at input terminals IN1 and IN2 and estimated phase signal $\Phi_{2'}(t)$ of second signal $\Phi_2(t)$ is output from output terminal OUT like in the first and second embodiments. However, in this embodiment, the following equation (11) obtained by modifying equation (9) is used to perform phase comparison unlike in the above embodiments:

$$\Phi_1(t)\cdot(N_2/N_1)=\Phi_2(t) \tag{11}$$

Therefore, the same reference numerals in FIG. 3 denote the same parts as in FIGS. 1 and 2, and a detailed description thereof will be omitted.

First signal $\Phi_1(t)$ is supplied to phase signal estimator 1 and is filtered, and is output as estimated phase signal $\Phi_{1'}(t)$. The phase of second signal $\Phi_2(t)$ is multiplied with N$_1$/N$_2$ by second frequency divider/multiplier 10, and the obtained signal is input to the "+" input of phase comparator 4. The output from phase comparator 4 is applied to low-pass filter 5, and is then applied to VCO 6. Thus, a signal having a frequency corresponding to the output from filter 5 is generated. This signal is applied to one input terminal of phase adder 7, and is added to estimated phase signal $\Phi_{1'}(t)$ as the output from phase signal estimator 1. The output from phase adder 7 is frequency divided and multiplied by first frequency divider/multiplier 2, thus obtaining desired filtered output signal $\Phi_{2'}(t)$.

FIG. 4 shows an embodiment of a GPS signal filtering apparatus according to the present invention, which is used in a GPS receiving apparatus for processing a phase signal sent from a GPS satellite and performing positioning and ranging measurement. The apparatus of the fourth embodiment comprises three sections, i.e., C/A-code PLL section A, P-code PLL section B, and carrier PLL section C. The arrangement of C/A-code PLL section A for reproducing input phase signal $\psi_{C/A}(t)$ is the same as that of a typical PLL, and is basically constituted by phase comparator 42, loop filter 43, and VCO 44. P-code and carrier PLL sections B and C also include phase comparators 48 and 55, loop filters 49 and 56, and VCOs 50 and 57, respectively. However, unlike in the typical PLL arrangement, assumed phase signals of output and input phase signals $\psi_P(t)$ and $\psi_{CAR}(t)$ of VCOs 50 and 57 are summed for respective phases, and the sum signal is used as a feedback signal.

The arrangement of the PLL in the embodiment shown in FIG. 4 is different from of the typical PLL for the following reasons:

(1) Positive and negative frequency signals must be distinguished from each other without ambiguity.

(2) A sum phase signal of two signals must be easily realized. Thus, all the signals except for input phase signals and input/output signals of the loop filters are processed in the form of complex signals, and a phase/complex signal converter for converting input phase signals into complex signals is arranged in association therewith.

A GPS signal can be expressed by the following equation:

$$S(t)=A(t)e^{j\Phi} \tag{12}$$

where $A(t)$ and $\Phi(t)$ are the arbitrary time functions taking real values, and $S(t)$ is the arbitrary time function taking a complex value. In the following description, a time function taking a real value will be referred to as a real signal, and a time function taking a complex value will be referred to as a complex signal. $\Phi(t)$ can be interpreted as a function representing a phase of a signal. Assuming that $A(t)$ can be normalized to be $A(t)=1$ by an amplitude limiter, equation (12) can be simplified as follows:

$$S(t)=e^{j\Phi(t)} \tag{13}$$

Since equation (13) is a periodic function having a period of $2\pi$ radian, if $\Phi(t)$ is obtained from the following equation:

$$\Phi(t)=\tan^{-1}[Re\{S(t)\}/Im\{S(t)\}]+2n\pi \tag{14}$$

(where Re$\{S(t)\}$ is the function representing a real part of S(t), Im is the function representing an imaginary part of S(t), and n is an arbitrary integer), ambiguity of $2\pi$ radian is generated, and true phase angle $\Phi(t)$ cannot be uniquely determined. Three input phase signals $\psi_{C/A}(t)$, $\psi_P(t)$, and $\psi_{CAR}(t)$ in FIG. 4 are respectively given by the following equations:

$$\psi_{C/A}(t) = \Phi_{C/A}(t) + 2n_1\pi \tag{15}$$

$$\psi_P(t) = \Phi_P(t) + 2n_2\pi$$

$$\psi_{CAR}(t) = \Phi_{CAR}(t) + 2n_3\pi$$

where $\Phi_{C/A}(t)$ is the true C/A-code phase signal, $\Phi_P(t)$ is the true P-code phase signal, $\Phi_{CAR}(t)$ is the true carrier phase signal, and n1, n2, and n3 are arbitrary integers.

First second, and third phase/complex signal converters 41, 47, and 54 respectively receive three input phase signals $\psi_{C/A}(t)$, $\psi_P(t)$, and $\psi_{CAR}(t)$, which are separately input from GPS receiver 100, at input terminals $IN_{11}$, $IN_{12}$, and $IN_{13}$, and generate complex signals given by $e^{j\psi C/A(T)}$, $e^{j\psi P(T)}$, and $e^{j\psi AD(t)}$, respectively. A phase difference signal between two complex signals is obtained by multiplying one complex signal with a conjugate complex signal, as can be seen from the following equation:

$$e^{j\{\psi 1(t) - \psi 2(t)\}} = e^{j\psi 1(t)} \cdot \epsilon - j\psi 2(t) = e^{j\psi 1(t)}\{\epsilon j\psi 2(t)\}* \quad (16)$$

where * is the operator for obtaining a conjugate complex.

Each of first, second and third phase comparators 42, 48, and 55 receives two complex signals given by equation (16), and outputs a complex signal obtained by multiplying the received signals, thus performing phase comparison. Each of first, second, and third conjugate complex operators 46, 53, and 59 receives a complex signal in brackets in equation (16), and outputs a complex signal conjugate therewith. First, second, and third loop filters 43, 49, and 56 respectively determine loop response characteristics of C/A-code PLL section A, P-code PLL section B, and carrier PLL section C. First, second, and third VCOs 44, 50, and 57 generate complex signals having frequencies proportional to their input control voltages. First and second frequency dividers 45 and 52 frequency/phase divide complex signals at a frequency division ratio of 1:10NL and 1:NL, respectively. First phase adder 51 receives the output signal from C/A-code PLL section A and the output signal from second VCO 50, and outputs a sum phase signal, and second phase adder 58 receives the output signal from P-code PLL section B and the output signal from third VCO 57 and outputs a sum phase signal. The operation of C/A-code PLL section A will be described below.

One input of first phase comparator 42 receives $e^{j\psi C/A(t)}$ which is obtained by converting input C/A-code phase signal $\psi_{C/A}(t)$ to a complex signal by first phase/complex signal converter 41. The other input of first phase comparator 42 receives complex signal $\epsilon j\psi'_{C/A}(t)$ obtained by frequency/phase dividing the output signal from first VCO 44 by first frequency divider 45 and performing conjugate complex arithmetic processing of the signal by first conjugate complex operator 46. Thus, first phase comparator 42 outputs phase difference signal $\psi_{d1}'(t)$ given by the following equation from complex signal $e^{j\{\psi C/A(t) - \psi' C/A(t)\}}$ obtained by multiplying two complex signals given by equation (16):

$$\psi_{d1}(t) = \psi_{C/A}(t) - \psi'_{C/A}(t)\psi$$
$$\psi_{d1}'(t) = \tan^{-1}\{\sin\psi_{d1}(t)/\cos\psi_{d1}(t)\} \quad (17)$$

Since C/A-code PLL section A is an automatic control system which operates to approximate $\psi_{d1}'(t)$ in equation (17) to zero:

$$\psi'_{C/A}(t) \approx \psi_{C/A}(t) \quad (18)$$

Thus, output complex signal $e^{j10NL\psi'C/A(t)}$ of C/A-code PLL section A is phase-locked with input signal $e^{j\psi C/A(t)}$, and is very close to a signal whose phase is multiplied with 10NL. This signal is utilized as an estimated phase signal of P-code input phase signal $\psi_p(t)$.

The operation of P-code PLL section B is substantially the same as that of C/A-code PLL section A, except that a sum phase signal of the output signal from second VCO 50 and the output signal from C/A-code PLL section A obtained by first phase adder 51 is used as the feedback signal, and a frequency division ratio of second frequency divider 12 is 1:NL.

Like in C/A-code PLL section A, since P-code PLL section B is an automatic control system which operates to approximate the phase difference output signal from second phase comparator 48 to zero, phase signal $\psi'p(t)$ of the output signal from P-code PLL section B is:

$$\psi'_p(t) \approx \psi_p(t) \quad (19)$$

Thus, output complex signal $\epsilon j0NL\psi'p(t)$ from P-code PLL section B is phase-locked with input signal $e^{j\psi p(t)}$, and is very approximate to a signal whose phase is multiplied with NL. As a result, output signal $e^{j10NL\psi'C/A(t)}$ functions as a disturbance in P-code PLL section B, and the oscillation frequency of second VCO 50 becomes very close to zero.

The operation of carrier PLL section C is substantially the same as that of P-code PLL section B, except that a sum phase signal of the output signal from third VCO 57 and the output signal from P-code PLL section B obtained by third adder 58 is used as a feedback signal, and no frequency divider is inserted in the feedback loop. Like in P-coded PLL section B, since carrier PLL section C is an automatic control system which operates to approximate the phase difference output signal from third phase comparator 55 to zero, phase signal $\psi'_{CAR}(t)$ of the output signal from carrier PLL section C is:

$$\psi'_{CAR}(t) = \psi_{CAR}(t) \quad (20)$$

Thus, output complex signal $e^{j\psi'CAR(t)}$ from carrier PLL section C is very approximate to input signal $e^{j\psi CAR(t)}$. The output complex signal is supplied to signal processing device 101 for the purpose of positioning and ranging measurement, and is subjected to predetermined processing.

As a result, output signal $e^{jNL\psi'p(t)}$ from P-code PLL section B serves as a disturbance in carrier PLL section C, and the oscillation frequency of third VCO 57 is very close to zero.

As described above, unlike in the conventional PLL filtering apparatus which has a single-stage arrangement and, when a plurality of signals are processed, independently performs PLL filtering of the input phase signals, the characteristic feature of the present invention lies in that the PLL circuit has a two-stage arrangement, and a residual phase signal of an input phase signal and an estimated phase signal is PLL-filtered. If estimation accuracy of an estimated phase signal is sufficiently high, the residual signal does not include a Doppler frequency and acceleration Doppler frequency of higher order or if it includes them, their absolute values are greatly reduced. Therefore, the residual signal becomes a signal in which electric power is concentrated near a DC level. With this arrangement, the following advantages can be obtained without sacrificing performance.

(1) Natural angular frequency $\omega n$ can be decreased as small as possible.

(2) A 2nd-order PLL can be employed. The advantage (1) is a condition required when a desired one of two or more satellite signals must be extracted (especially, P-code phase), and a low-C/N ratio signal must be processed. The advantage (2) is a condition required when a simplified algorithm must be stably operated.

Since phase comparison can be achieved by sampling signals, the apparatus of this invention is effective when an input signal is a digital signal and even when an input phase signal is one suffering from a foldover distortion due to undersampling. Thus, a sampling frequency much lower than the one determined by the sampling theorem can be selected. Thus, a data volume necessary for signal processing can be greatly reduced, and a processing-speed requirement can be greatly reduced.

From the operation principle of the PLL, after the PLL filtering apparatus is locked in an input signal, it is kept locked in unless an unusually large disturbance is input. Therefore, a phase continuous signal free from cycle slip can be obtained at the output of this apparatus, and the subsequent processing including removal of ambiguity can be much facilitated.

What is claimed is:

1. A phase signal filtering apparatus, comprising:
   phase signal estimation means for receiving a first phase signal having a first frequency and for generating a first filtered signal phase-locked with the first phase signal as an estimated phase signal;
   phase locked loop means for receiving a second phase signal having a second frequency which corresponds to a predetermined multiple of the first frequency of the first phase signal, and for outputting a second filtered signal phase-locked with the second phase signal as a desired phase signal, said phase lock means comprising:
      phase comparator means for receiving the second phase signal and the desired phase signal, and for generating a phase difference signal;
      filtering means for low-pass filtering the phase difference signal from said phase comparator means;
      signal generating means for generating a signal having a predetermined frequency in accordance with the output from said filtering means; and
      phase adder means for adding the signal having the predetermined frequency from said signal generating means and the estimated phase signal from said phase signal estimation means, and for outputting the desired phase signal; and
   means connected to at least one of the estimated phase signal, the second phase signal, and the desired phase signal, for controlling said phase locked loop means to have substantially the same low-pass filtering response characteristic as the first frequency of the first phase signal;
   wherein a ratio of the first and the second frequencies is a ratio of integers $N_1$ and $N_2$; and
   said means for controlling includes frequency divider/multiplier means connected to an output section of said phase signal estimation means for causing said phase signal estimation means to output the estimated phase signal having a frequency $N_2/N_1$ times the frequency of the first filtered signal.

2. An apparatus according to claim 1, wherein said phase signal estimation means comprises a phase locked loop having a low-phase filtering response characteristic.

3. An apparatus according to claim 1, wherein a ration of the first and second frequencies is selected to be 10 or more.

4. A phase signal filtering apparatus for receiving first and second input signals, a ratio of frequencies of which is a ratio of integers $N_1$ and $N_2$, and filtering the second input signal to obtain an output the generated signal, comprising:
   a phase signal estimator for receiving the first input signal and generating a filtered signal phase-locked with the first input signal;
   a first frequency divider/multiplier for receiving the filtered signal and generating an estimated phase signal having a frequency $N_2/N_1$ times the frequency of the filtered signal;
   a phase comparator for receiving the second input signal and the output signal and forming a phase difference signal;
   a filter for low-pass filtering the phase difference signal;
   a signal generator for generating a signal having a frequency proportional to the output from said filter; and
   a phase adder for adding phases of the signal having a proportional frequency and the estimated phase signal so as to output said output signal.

5. An apparatus according to claim 4, wherein said apparatus further comprises a first phase/complex signal converter for converting a phase of the first input signal into a complex signal, and sending the converted complex signal to said phase signal estimator, and sceond phase/complex signal converter for converting a phase of the second input signal into a complex signal and sending the converted complex signal to said phase comparator, and the compared signal is filtered to obtain an output complex signal.

6. A phase signal filtering apparatus for receiving first and second input signals, a ratio of frequencies of which is a ratio of integers $N_1$ and $N_2$, and filtering the second input signal to obtain an output signal comprising:
   a phase signal estimator for receiving the first input signal and generating a filtered signal phase-locked with the first input signal;
   a first frequency divider for receiving the filtered signal and generating an estimated phase signal having a frequency $1/N_1$ the frequency of the filtered signal;
   a second frequency divider for receiving the second input signal and generating a first phase signal having a frequency $1/N_2$ the frequency of the second input signal;
   a phase comparator for receiving the first phase signal and a second phase signal for forming a phase difference signal;
   a filter for low-phase filtering the phase difference signal;
   a signal generator for generating a signal having a frequency proportional to the output from said filter;
   a phase adder for adding phases of the generated signal having a proportional frequency and the estimated phase signal so as to output the second phase signal; and
   a multiplier for receiving the second phase signal and generating the output signal having a frequency $N_2$ times the frequency of the second phase signal.

7. An apparatus according to claim 6, wherein said apparatus further comprises a first phase/complex signal converter for converting a phase of the first input signal into a complex signal, and sending the converted complex signal to said phase signal estimator, and a second phase/complex signal converter for converting a phase of the second input signal into a complex signal and sending the converted complex signal to said phase comparator, and the compared signal is filtered to obtain an output complex signal.

8. A phase signal filtering apparatus for receiving first and second input signals, a ratio of frequencies of which is a ratio of integers $N_1$ and $N_2$, and filtering the second input signal to obtain an output the generated signal, comprising:

an phase signal estimator for receiving the first input signal and generating an estimated phase signal phase-locked with the first input signal;

a first frequency divider/multiplier for receiving the second input signal and generating a first phase signal having a frequency $N_1/N_2$ times the frequency of the second input signal;

a phase comparator for receving the first phase signal and a second phase signal and forming a phase difference signal;

a filter for low-pass filtering the phase difference signal;

a signal generator for generating a signal having a frequency proportional to the outut from said filter;

a phase adder for adding phases of the signal having the proportional frequency and the estimated phase signal so as to output the second phase signal; and a second frequency divider/multplier for receiving the second phase signal and generating the output signal having a frequency $N_2/N_1$ times the frequency of the second phase signal.

9. An apparatus according to claim 8, wherein said apparatus further comprises a first phase/complex signal converter for converting a phase of the first input signal into a complex signal, and sending the converted complex signal to said phase signal estimator, and a second phase/complex signal converter for converting a phase of the second input signal into a complex signal and sending the converted complex signal to said phase comparator, and the compared signal is filtered to obtain an output complex signal.

10. A GPS (Global Positioning System) signal PLL phase locked loop filtering apparatus serving as a prefiltering apparatus used in a GPS receiver which receives three phase signals $\psi_{C/A}(t)$, $\psi_p(t)$, and $\psi_{CAR}(t)$ which are sent from a GPS satellite and are related by:

$$\psi_{CAR}(t) = 154\psi_p(t) \quad (1)$$

$$\psi_p(t) = 10\psi_{C/A}(t)$$

and processes the three phase signals to perform positioning or ranging measurement, comprising:

a phase/complex signal converter for receiving the phase signal $\psi_{C/A}(t)$ and generating a (1a)th complex signal $e^{j\psi_{C/A}(t)}$;

a first phase comparator including means for receiving the (1a)th complex signal and a (1b)th complex signal $\epsilon^{-j\hat{\psi}_{C/A}(t)}$ and generating a phase difference signal $\psi_{d1}'(t)$ calculated by equations (2) from a phase component $\psi_{C/A}(t) - \hat{\psi}_{C/A}(t)$ of a product $e^{j\{\psi_{C/A}(t) - \hat{\psi}_{C/A}(t)\}}$ of the (1a)th and (1b)th complex signals:

$$\psi_{d1}(t) = \psi_{C/A}(t) - \hat{\psi}_{C/A}(t) \quad (2)$$

-continued
$$\psi_{d1}'(t) = \tan^{-1}(\sin\psi\, d1(t)/\cos\psi\, d1(t))$$

a first loop filter for receiving the phase difference signal $\psi_{d1}'(t)$ and generating a first oscillation frequency control signal;

a first voltage controlled oscillator for receiving the first oscillation frequency control signal and generating a first phase continuous signal having a frequency proportional to the first oscillation frequency control signal;

a first frequency divider for receiving and frequency dividing the first phase continuous signal to generate a first complex signal $e^{j\hat{\psi}_{C/A}(t)}$;

a first conjugate complex operator for receiving the first complex signal $e^{j\hat{\psi}_{C/A}(t)}$ and generating the (1b)th complex signal $\epsilon^{-j\hat{\psi}_{C/A}(t)}$ conjugate therewith;

a second phase/complex signal converter for receiving the phase signal $\psi_p(t)$ and generating a (2a)th complex signal $\epsilon j\psi_p(t)$;

a second phase comparator including means for receiving the (2a)th complex signal and a (2b)th complex signal $\epsilon^{-j\hat{\psi}_p(t)}$ and generating a phase difference signal $\psi_{d2}'(t)$ calculated by equations (3) from a phase component $\psi_p(t) - \hat{\psi}_p(t)$ of a product $e^{j\{\psi_p(t) - \hat{\psi}_p(t)\}}$ of the (2a)th and (2b)th complex signals:

$$\psi_{d2}(t) = \psi_p(t) - \hat{\psi}_p(t) \quad (3)$$

$$\psi_{d2}'(t) = \tan^{-1}(\sin\psi\, d2(t)/\cos\psi\, d2(t))$$

a second loop filter for receiving the phase difference signal $\psi_{d2}'(t)$ and generating a second oscillation frequency control signal;

a second voltage controlled oscillator for receiving the second oscillation frequency control signal and generating a second phase continuous signal having a frequency proportional to the second oscillation frequency control signal;

a first phase adder for receiving the first and second phase continuous signals and generating a first sum signal of the two signals;

a second frequency divider for receiving a frequency dividing the first sum signal to generate a second complex signal $e^{j\hat{\psi}_p(t)}$;

a second conjugate complex operator for receiving the second complex signal $e^{j\hat{\psi}_p(t)}$ and generating the (2b)th complex signal $\epsilon^{-j\hat{\psi}_p(t)}$ conjugated therewith;

a third phase/complex signal converter for receiving the phase signal $\psi_{C/A}(t)$ and generating a (3a)th complex signal $e^{j\psi_{CAR}(t)}$;

a third phase comparator including means for receiving the (3a)th complex signal and a (3b)th complex signal $\epsilon^{-j\hat{\psi}_{CAR}(t)}$ and generating a phase difference signal $\psi_{d3}'(t)$ calculated by equations (4) from a phase component $\psi_{CAR}(t) - \hat{\psi}_{CAR}(t)$ of a product $\epsilon j\{\psi_{CAR}(t) - \hat{\psi}_{CAR}(t)\}$ of the (3a)th and (3b)th complex signals:

$$\psi_{d3}(t) = \psi_{CAR}(t) - \hat{\psi}_{CAR}(t) \quad (4)$$

$$\psi_{d3}'(t) = \tan^{-1}(\sin\psi\, d3(t)/\cos\psi\, d3(t))$$

a third loop filter for receiving the phase difference signal $\psi_{d3}'(t)$ and generating a third oscillation frequency control signal;

a third voltage controlled oscillator for receiving the third oscillation frequency control signal and generating a third phase continuous signal having a frequency proportional to the third oscillation frequency control signal;

a second phase adder for receiving the second and third phase continuous signals and generating a second sum signal of the two signals; and a third conjugate complex operator receiving the second sum signal and generating the (3b)th complex signal $\epsilon^{-j\psi CAR(t)}$ conjugated therewith.

11. A phase signal filtering apparatus, comprising:

phase signal estimation means for receiving a first phase signal having a first frequency and for generating a first filtered signal phase-locked with the first phase signal as an estimated phase signal;

phase locked loop means for receiving a second phase signal having a second frequency which corresponds to a predetermined multiple of the first frequency of the first phase signal, and for outputting a second filtered signal phase-locked with the second phase signal as a desired phase signal, said phase lock loop means comprising:

phase comparator means for receiving the second phase signal and the desired phase signal, and for generating a phase difference signal;

filtering means for low-pass filtering the phase difference signal from said phase comparator means;

signal generating means for generating a signal having a predetermined frequency in accordance with the output from said filtering means; and phase adder means for adding the signal having the predetermined frequency from said signal generating means and the estimated phase signal from said phase signal estimation means, and for outputting the desired phase signal; and means connected to at least one of the estimated phase signal, the second phase signal, and the desired phase signal, for controlling said phase locked loop means to have substantially the same low-pass filtering response characteristic as the first frequency of the first phase signal;

wherein a ratio of the first and the second frequencies is a ratio of integers $N_1$ and $N_2$; and said means for controlling includes first frequency divider/multiplier means connected to an output section of said phase signal estimation means, for causing said phase signal estimation means to output the estimated phase signal having a frequency $1/N_1$ the frequency of the first filtered signal, second frequency divider means, connected to an input section of the second phase signal, for frequency dividing the frequency of the second phase signal to $1/N_2$, and multiplier means, connected to an output section of said phase adder means, for outputting the desired phase signal having a frequency $N_2$ times the frequency of the second filtered signal.

12. A phase signal filtering apparatus, comprising:

phase signal estimation means for receiving a first phase signal having a first frequency and for generating a first filtered signal phase-locked with the first phase signal as an estimated phase signal;

phase locked loop means for receiving a second phase signal having a second frequency which corresponds to a predetermined multiple of the first frequency of the first phase signal, and for outputting a second filtered signal phase-locked with the second phase signal as a desired phase signal, said phase lock loop means comprising:

phase comparator means for receiving the second phase signal and the desired phase signal, and for generating a phase difference signal;

filtering means for low-pass filtering the phase difference signal from said phase comparator means;

signal generating means for generating a signal having a predetermined frequency in accordance with the output from said filtering means; and phase adder means for adding the signal having the predetermined frequency from said signal generating means and the estimated phase signal from said phase signal estimation means, and for outputting the desired phase signal; and means connected to at lease one of the estimated phase signal, the second phase signal, and the desired phase signal, for controlling said phase locked loop means to have substantially the same low-pass filtering response characteristic as the first frequency of the first phase signal;

wherein a ratio of the first and the second frequencies is a ratio of integers $N_1$ and $N_2$; and said means for controlling includes first frequency divider/multiplier means, connected to an input section of the phase locked loop means, for frequency dividing/multiplying the frequency of the second phase signal by $N_1/N_2$, and second frequency divider/multiplier means, connected to an output section of the phase adder means, for frequency dividing/multiplying the frequency of the second filtered signal $N_2/N_1$.

* * * * *

UNITED STATES PATENT AND TRADEMARK OFFICE
CERTIFICATE OF CORRECTION

PATENT NO. : 4,939,751

DATED : July 3, 1990

INVENTOR(S) : Masahiro KURODA

It is certified that error appears in the above-identified patent and that said Letters Patent is hereby corrected as shown below:

Title page, under "U.S. PATENT DOCUMENTS", change 4,445,184 to --4,445,118--.

Signed and Sealed this

Twenty-sixth Day of October, 1993

*Attest:*

BRUCE LEHMAN

*Attesting Officer*    *Commissioner of Patents and Trademarks*